(12) United States Patent
Iyer et al.

(10) Patent No.: US 9,048,084 B2
(45) Date of Patent: Jun. 2, 2015

(54) APPARATUS AND METHOD FOR EXTENDING BANDWIDTH AND SUPRESSING PHASE ERRORS IN MULTI-PHASE SIGNALS

(71) Applicant: Intel Corporation, Santa Clara, CA (US)

(72) Inventors: Sitaraman V. Iyer, San Jose, CA (US); Guluke Tong, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/331,023

(22) Filed: Jul. 14, 2014

(65) Prior Publication Data

US 2014/0320202 A1  Oct. 30, 2014

Related U.S. Application Data

(63) Continuation of application No. 13/537,638, filed on Jun. 29, 2012, now Pat. No. 8,779,823.

(51) Int. Cl.
*H01L 25/00* (2006.01)

(52) U.S. Cl.
CPC .......... *H01L 25/00* (2013.01); *H01L 2924/0002* (2013.01)

(58) Field of Classification Search
USPC ......................................... 327/108
See application file for complete search history.

(56) References Cited

U.S. PATENT DOCUMENTS 7,969,222 B2    6/2011  Bouras
8,766,712 B2 *  7/2014  Shanan ................. 327/552

* cited by examiner

*Primary Examiner* — Daniel Rojas
(74) *Attorney, Agent, or Firm* — Blakely, Sokoloff, Taylor & Zafman LLP

(57) ABSTRACT

Described herein is an integrated circuit which comprises: a first buffer, with positive trans-conductance, to drive a first signal with first phase; and a second buffer, with negative trans-conductance, to drive a second signal with second phase, wherein the first buffer and the second buffer are cross-coupled to one another.

19 Claims, 7 Drawing Sheets

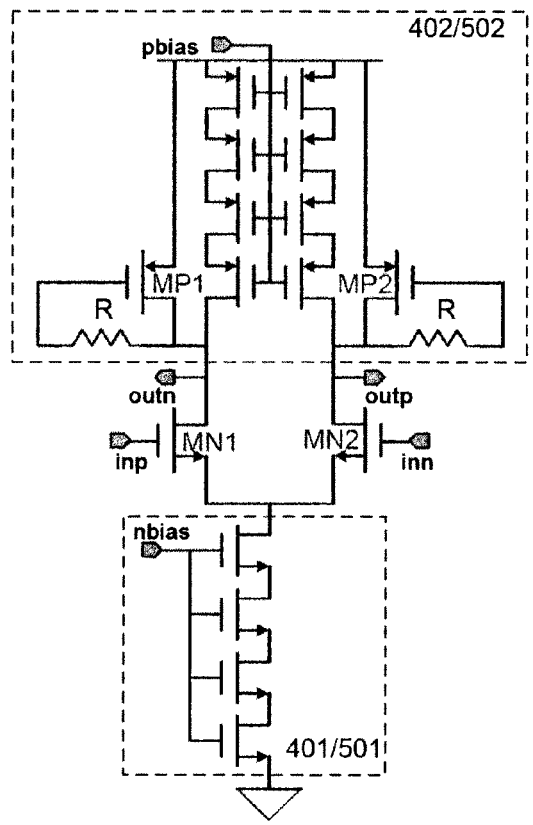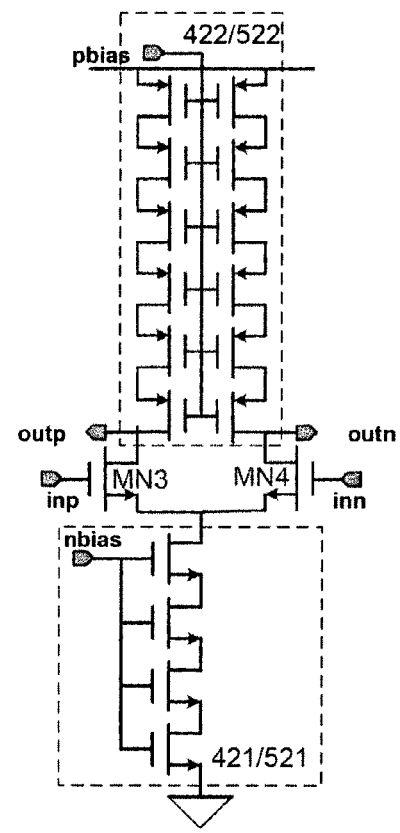
FIG. 5A  FIG. 5B

APPARATUS AND METHOD FOR EXTENDING BANDWIDTH AND SUPRESSING PHASE ERRORS IN MULTI-PHASE SIGNALS

PRIORITY

This application is a continuation of, and claims the benefit of priority of, application Ser. No. 13/537,638, filed Jun. 29, 2012 "which is hereby incorporated by reference in its entirety into this application".

BACKGROUND

Multiphase signals generated and distributed over a long distance (e.g., over 3 mm) of interconnects in a processor or motherboard may become distorted with noise such as jitter at receiving ends. Such jitter includes phase error between the quadrature signals. For example, quadrature signals having two or more signals with phases separated from one another by 90 degrees may become distorted resulting in phase error of several degrees between one another. Phase error in such signals pose a problem for meeting the requirements of high speed signal distribution with low power consumption.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 5A-B are circuit level illustrations of trans-conductors used in the cross-coupled trans-conductors of the signal distribution network to suppress phase errors in multiphase signals, according to one embodiment of the disclosure.

DETAILED DESCRIPTION

Figure 1:
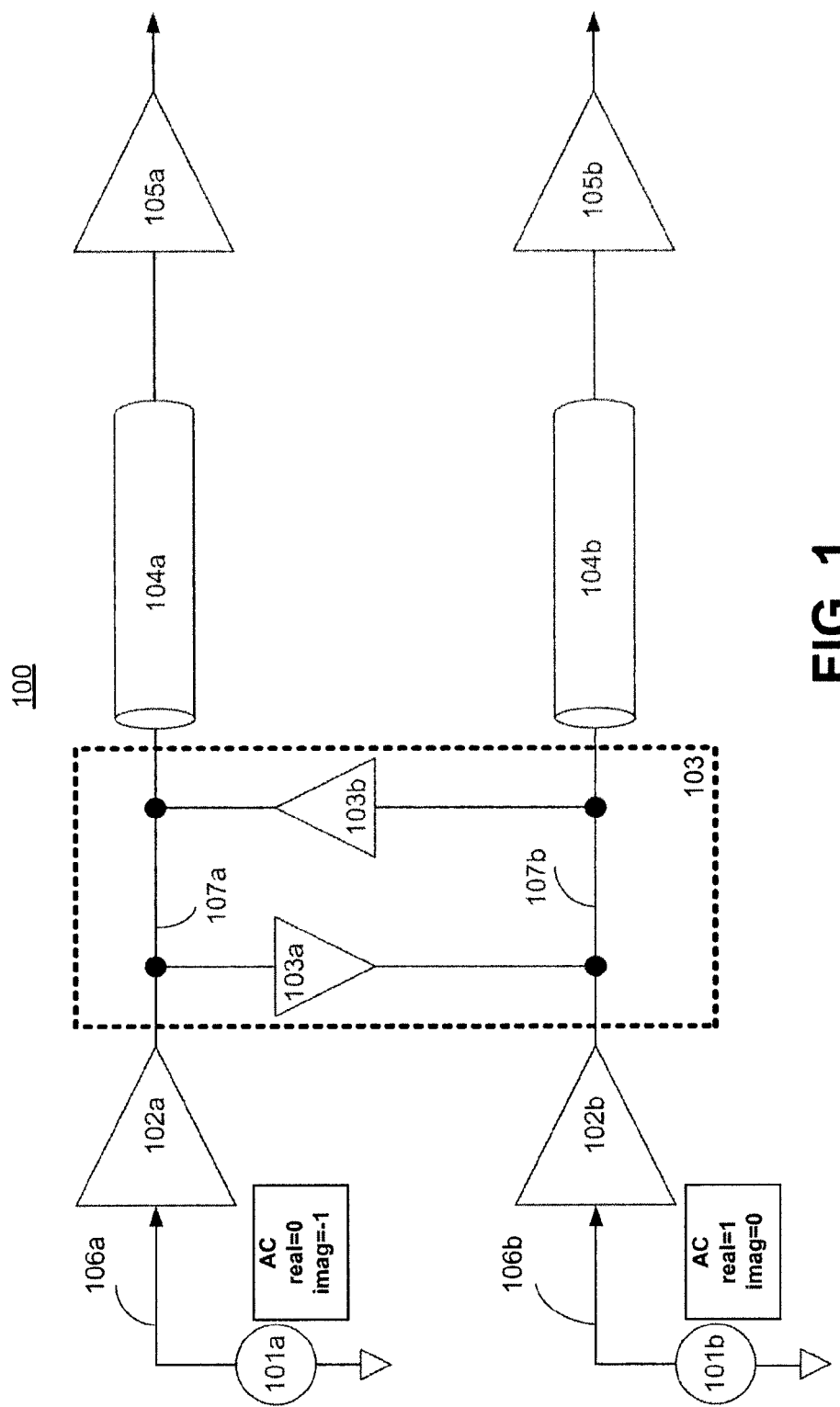
FIG. 1 is a lumped signal distribution network with apparatus to suppress phase errors in multiphase signals, according to one embodiment of the disclosure.

In wide high speed serial transceivers such as Peripheral Component Interconnect Express (PCIe) and QuickPath Interconnect (QPI) by Intel Corporation of Santa Clara, Calif., it is common practice to share a single Phase Locked Loop (PLL) across several transceivers. A shared PLL saves area and power consumption, and reduces clock domain crossings and associated latencies in the data path.

For example, some processors may share a single PLL across several (e.g., 40 or 44) PCIe lanes. Such sharing of a single PLL over a long clock distribution (e.g., 4-5 mm) network originating from the PLL, which is approximately centered between the lanes to the farthest lane, may make the clock signals susceptible to noise (e.g., jitter). The overall transceiver link margin is sensitive to the jitter on the clock path from the clock distribution network. In some examples, multiphase signals such as quadrature clock signals are used to feed phase interpolators, at the receiver end, which produces an output clock phase with fine resolution phase control.

The term "quadrature" herein refers to signal phases separated by 90 degrees. The quadrature phase error between global in-phase (I) and quadrature (Q) clocks may need to be contained while maintaining low power supply noise induced jitter and low jitter amplification in the clock distribution path. For PCIe, both I and Q clocks are outputs of a PLL. For QPI, both I and Q clocks are outputs of a delay locked loop (DLL).

One approach to reduce jitter amplification is to use Complementary metal-oxide-semiconductor (CMOS) based inverters in the clock path. CMOS inverters are, however, sensitive to power supply noise and require a relatively clean or regulated power supply. Another approach to reduce jitter amplification is to use current mode logic (CML) or differential buffers because they are relatively insensitive to power supply noise compared to CMOS based inverters.

However CML buffers are more limited in bandwidth and, therefore, amplify jitter more than CMOS clock distributions comprising CMOS based inverters. In the absence of a clean (i.e., noiseless) power supply, a CMOS clock distribution may not be an option for high speed links that are pushing the speed limits of motherboard interconnects.

One way to improve jitter amplification of CML clock distribution networks includes the use of Alternating Current (AC) coupling, lumped inductors, band-pass buffers, and passive transmission lines.

Lumped inductors are generally not friendly to physical layout while passive transmission lines may provide a solution to jitter amplification for transmission lines less than 2 mm in length, i.e., short transmission line lengths. For example, beyond 2 mm of lengths there is significant degradation in the signal swing through the transmission lines which impacts performance of downstream clock path. The length constraint becomes increasingly relevant for highly scaled processes where the interconnect bandwidth is substantially degraded. Furthermore, quadrature phase error increases as the length of the clock distribution and the number of buffers increases in the distribution network.

In receivers, a low swing phase interpolator is commonly used to generate a clock phase with fine and digitally controlled placement resolution. To maintain a linear relationship between digital control code, which is used to generate digitally controlled placement resolution for a clock signal, and the output phase smooth input quadrature clock waveforms are used. One method to smooth input quadrature clock waveforms is to apply a low pass filter to the input quadrature clocks. Low pass filtering, while attenuating higher order harmonics, may also result in bandwidth limitations and, therefore, jitter amplification.

The embodiments discussed herein present an apparatus to achieve low jitter amplification (e.g., one or less than one) by having an inherent peaking response while retaining fundamental tone in the clock signal. The apparatus herein also suppresses multiphase phase error (e.g., to less than 4 degrees in quadrature phase errors). The apparatus herein reduces (or may minimize) a number of buffers in the global clock path to reduce jitter (e.g., to less than 2 ps of jitter) because the bandwidth of the clock distribution network is enhanced. The apparatus herein also allows for generating quadrature clocks with minimum phase error without the use of a PLL or DLL. For example, a poly phase filter may be combined with multiple cascaded cross-coupled buffer stages to suppress multiphase signal phase error in the poly phase filter output i.e., multiphase signal (e.g., quadrature clocks) can be generated from a single input clock without the need for a DLL and PLL resulting in reduced area and power consumption.

The embodiments discussed herein are not limited to suppressing multiphase phase error, but can also be applied to shape waveforms in local receivers without increased jitter amplification. Other technical effects are also materialized with the embodiments discussed herein. So as not to obscure the embodiments of the disclosure, quadrature signals are discussed for multiphase signals. Any multiphase signal can be used with the embodiments herein.

The terms "substantially," "close," "approximately," "about," herein refer to being within +/−20% of a target value.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1 is a lumped signal distribution network 100 with apparatus to suppress phase errors in multiphase clock signals, according to one embodiment of the disclosure. In one embodiment, the signal distribution network 100 comprises a first driver 102a, a second driver 102b, cross-coupled trans-conductors 103, first interconnect 104a, second interconnect 104b, first receiver 105a, second receiver 105b, and multiphase signal generators 101a and 101b.

In one embodiment, the cross-coupled coupled trans-conductors 103 are coupled with the outputs of the first driver 102a and the second driver 102b, and the first interconnect 104a and the second interconnect 104b as shown. In one embodiment, the cross-coupled trans-conductors 103 comprises a first buffer 103a, with positive trans-conductance, to drive a signal with first phase 107a, wherein the signal with first phase 107a is generated from the first driver 102a which receives signal 106a from the multiphase signal generator 101a. In one embodiment, the cross-coupled trans-conductors 103 comprises a second buffer 103b, with negative trans-conductance, to drive the signal with second phase 107b, where the signal with second phase 107b is generated from the second driver 102b which receives signal 106b from the multiphase signal generator 101b, and where the first buffer 103a and the second buffer 103b are cross-coupled to one another as shown. In one embodiment, the positive trans-conductance and the negative trans-conductance have substantially the same magnitudes. The first buffer 103a and the second buffers 103b are discussed later with reference to FIGS. 4-5.

Referring back to FIG. 1, the first driver 102a and the second driver 102b may be implemented with any known circuit topology. For example, the first driver 102a and the second driver 102b are inverters or buffers with substantially the same design and size which are operable to receive signals 106a and 106b respectively and generate corresponding signals 107a and 107b. In the embodiments discussed here in the first driver 102a and the second driver 102b have the same design and size (W/L).

In one embodiment, the first and second phases of the signals (106a/106b) are about 90 degrees apart from one another. For example, the real component of the signal 106a, with first phase, is zero and the imaginary component of the signal 106a is negative one, while the real component of the signal 106b, with second phase, is positive one and the imaginary component of the signal 106a is zero, where the magnitude of the two signals is substantially the same.

In one embodiment, the first receiver 105a is positioned to receive the signal 107a with first phase over the first interconnect 104a. In one embodiment, the second receiver 105b is positioned to receive the signal 107b with second phase over the second interconnect 104b. In the embodiments discussed herein the first buffer 103a is positioned to drive the signal 107a of first phase over the second interconnect 104b while the second buffer 103b is positioned to drive the signal 107b of second phase over the first interconnect 104a.

In one embodiment, signal 107a is used to provide active trans-conductance via the cross-coupled trans-conductors 103 to supply the capacitive currents to the capacitive load of all components coupled to node carrying signal 107b, leaving the current from the first driver 102a to flow undiluted into the resistive load of all components coupled to node carrying signal 107a. In this embodiment, signal 107b is used to provide active trans-conductance via the cross-coupled trans-conductors 103 to supply the capacitive currents to the capacitive load of all components coupled to node carrying signal 107*a*, leaving the current from the second driver 102*b* to flow undiluted into the resistive load of all components coupled to node carrying signal 107*b*. The cross-coupled trans-conductors 103 thus improve bandwidth, reduce jitter amplification and suppress quadrature phase error.

Figure 2A:
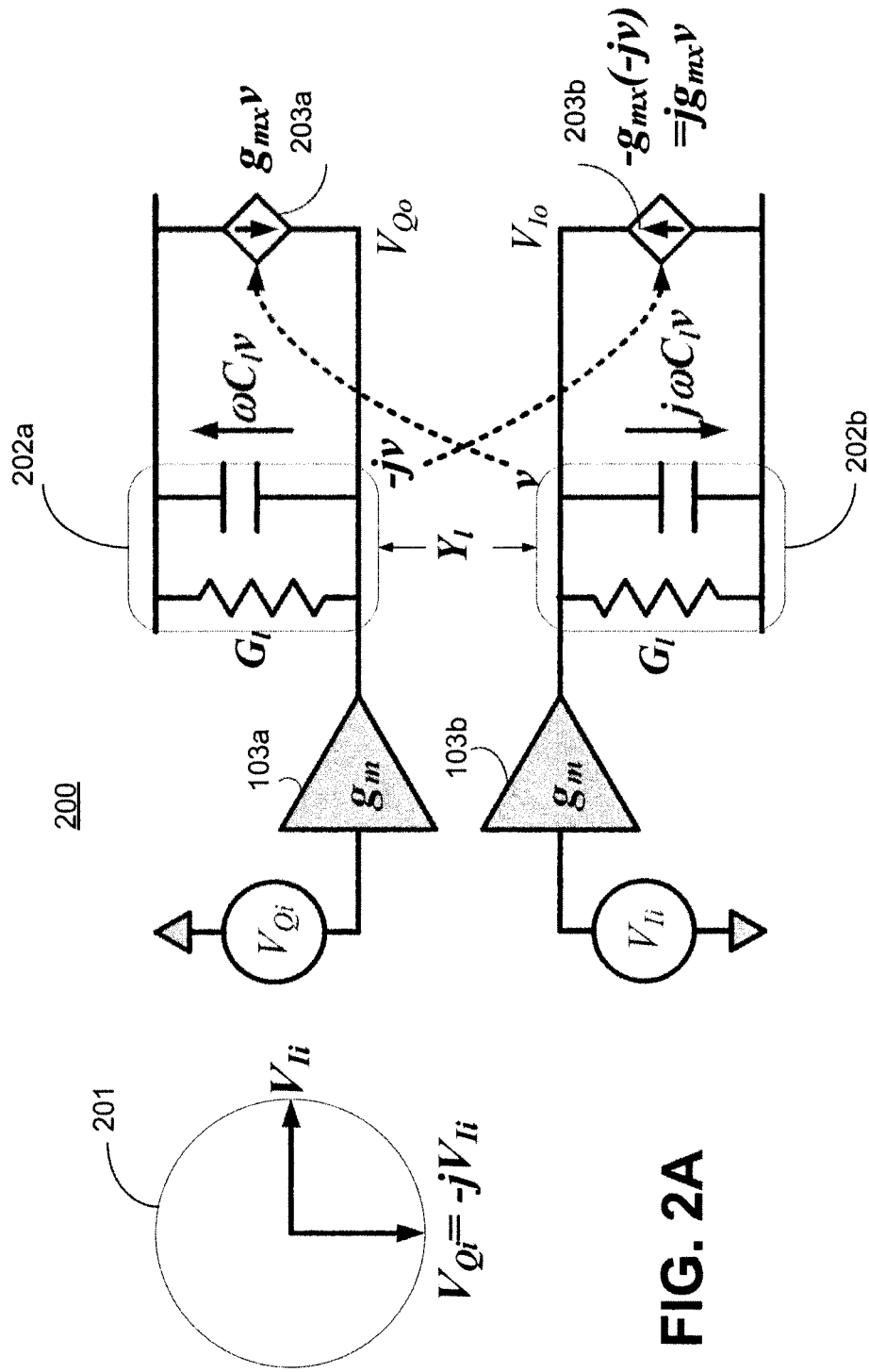
FIG. 2A is a conception illustration of the cross-coupled trans-conductors of the signal distribution network to suppress phase errors in multiphase signals, according to one embodiment of the disclosure.

FIG. 2A is a conception illustration 200 of the cross-coupled trans-conductors 103 of the signal distribution network, according to one embodiment of the disclosure. FIG. 2A is described with reference to FIG. 1. As discussed herein, bandwidth limitations in global clock paths may result from the combined capacitance of the on-chip interconnect and the lumped capacitive/resistive loads 202*a* and 202*b* at each tap point on the clock signal distribution path. A portion of the current that is pumped into interconnects (e.g., first interconnect 104*a* and second interconnect 104*b*) by the drivers (e.g., first driver 102*a* and second driver 102*b*) is diverted from the load to charge and discharge this effective capacitance as shown in 202*a* and 202*b*.

In one embodiment, the phase of the capacitive charging/discharging currents leads the voltage by 90 degrees as shown by chart 201, where $V_{Qi}$ is signal of first phase and $V_{Ii}$ is signal with second phase i.e., 90 degrees apart from the signal of first phase. In one embodiment, the quadrature voltage signals are used to provide active trans-conductance (via the cross-coupled trans-conductors 103-103*a* and 103*b*) to supply the capacitive currents, leaving the driver current to flow undiluted into the load resistor. In one embodiment, current from the first buffer 103*a* supplies capacitive current 203*a* to charge the capacitor of the load 202*b* while the current from the second buffer 103*b* supplies capacitive current 203*b* to charge the capacitor of the load 202*a*, where first buffer 103*a* is driven by signal 107*a* of first phase and the second buffer 103*b* driven by the signal 107*b* of second phase. The cross-coupled trans-conductors coupled together as shown in FIGS. 1-2 improve bandwidth, reduce jitter amplification and suppress quadrature phase error.

The symbols used in conception diagram of FIG. 2A refer to the following: $g_m$: trans-conductance of the driver, $G_l$: load conductance, $C_l$: load capacitance $g_{mx}$: trans-conductance of I-Q cross-coupling. In one embodiment, the 'Q' differential phase $V_{Qi}$ lags the 'I' differential phase $V_{Ii}$ by 90 degrees. As shown in FIG. 2A, $g_{mx}*v$ can be used to supply the current for capacitive load on the 'Q' phase and vice-versa. In one embodiment, for exact cancellation, the trans-conductance, $g_{mx}$, is equal in the magnitude of the susceptance ($\omega C_l$). In one embodiment, even if exact cancellation may not be achieved, partial cancellation of phase error still extends the baseline bandwidth. A linear analysis of the system shown in FIG. 2A is presented below.

In general, the quadrature outputs can be written as, $$V_{Io} = V_{Ii} \frac{g_m}{Y_l} \frac{Y_l^2}{Y_l^2 + g_{mx}^2} + V_{Qi} \frac{g_m}{Y_l} \frac{Y_l^2}{Y_l^2 + g_{mx}^2} \left(-\frac{g_{mx}}{Y_l}\right)$$ (Equation 1)

$$V_{Qo} = V_{Qi} \frac{g_m}{Y_l} \frac{Y_l^2}{Y_l^2 + g_{mx}^2} + V_{Ii} \frac{g_m}{Y_l} \frac{Y_l^2}{Y_l^2 + g_{mx}^2} \left(\frac{g_{mx}}{Y_l}\right)$$ (Equation 2)

For quadrature inputs, if $V_{Ii} = jV_{Qi}$, then the above equations are reduce to:

$$V_{Io} = V_{Ii} \frac{g_m}{Y_l - jg_{mx}} \quad \& \quad V_{Qo} = V_{Qi} \frac{g_m}{Y_l - jg_{mx}}$$ (Equation 3)

Furthermore, if $g_{mx} = \omega C_l$, $$V_{Io} = V_{Ii} \frac{g_m}{G_l} \quad \& \quad V_{Qo} = V_{Qi} \frac{g_m}{G_l}$$ (Equation 4)

in which case, all the current from the drivers flows into the resistive loads. In such an embodiment, the high frequency gain is boosted due to the removal of the susceptance portion of the effective load admittance. The direct current (DC) gain from the inputs ($V_{Ii}$, $V_{Qi}$) to the outputs ($V_{Io}$, $V_{Qo}$) is suppressed due to the negative feedback of the quadrature cross-coupling. In this embodiment, the power expended improves high frequency gain while actually suppressing low frequency gain, which is a more efficient usage of power than simply upsizing the driver.

In another example, the response of the quadrature cross-coupled system to inputs that are not exactly in quadrature is discussed. In this example, an input can be viewed as the sum of two sets of quadrature inputs (with subscripts 'a' and 'b') as shown in FIG. 2B.

Figure 2B:
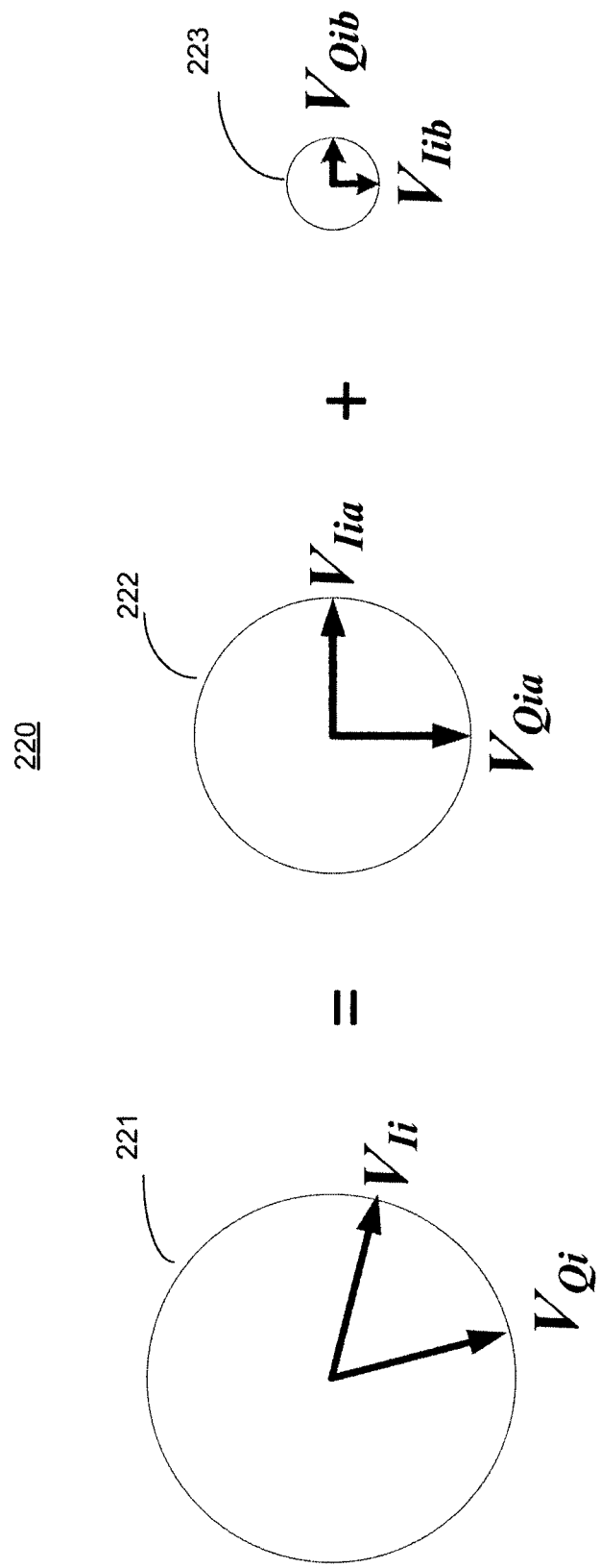
FIG. 2B illustrates decomposition of non-quadrature inputs into two sets of quadrature inputs.

FIG. 2B illustrates an equation 230 which is a decomposition of non-quadrature inputs $V_{Ii}$, $V_{Qi}$ 221 into two sets of quadrature inputs 222 and 223 respectively. For 222, $V_{Ia}$ leads $V_{Qia}$ by 90 degrees while for 223 $V_{Iib}$ lads $V_{Qib}$ by 90 degrees. While the "a" components have the desired quadrature phase relationship i.e., $V_{Ia} = jV_{Qa}$, the "b" components have the opposite quadrature phase relationship i.e., $V_{Ib} = -jV_{Qb}$. For the 'b' components Equations 1 and 2 above reduce to:

$$V_{Iob} = V_{Iib} \frac{g_m}{Y_l + jg_{mx}}$$ (Equation 5)

$$V_{Qob} = V_{Qib} \frac{g_m}{Y_l + jg_{mx}}$$ (Equation 6)

In this case, the quadrature cross-coupling trans-conductance appears as additional capacitive loads and attenuates the components of the inputs that do not have the quadrature relationship. This leads to suppression of the quadrature phase errors.

Figure 3:
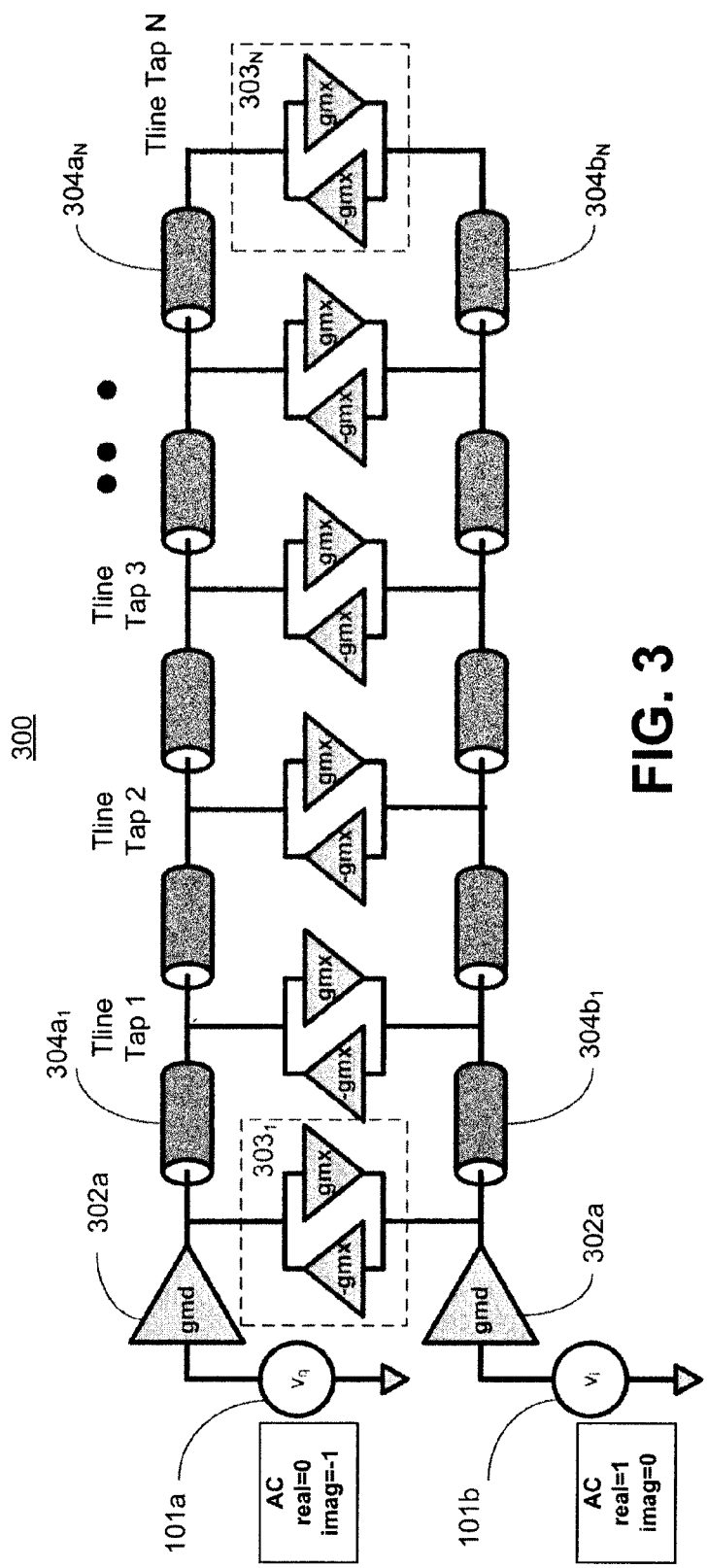
FIG. 3 a signal distribution network with apparatus to suppress phase errors in multiphase signals, according to another embodiment of the disclosure.

FIG. 3 a signal distribution network 300 for a long interconnect or transmission line (Tline) with apparatus to suppress phase errors, according to one embodiment of the disclosure. The embodiment of FIG. 3 is similar to the embodiment of FIG. 1 but with a distributed network model. In one embodiment, the distributed network comprises a plurality of tap points (Tline Tap 1-N) between first transmission lines 304*a*$_{1-N}$ (Tlines or interconnects), where 'N' is a positive integer. In one embodiment, the distributed network further comprises a plurality of tap points (Tline Tap 1-N) between second transmission lines 304*b*$_{1-N}$ pairs of cross-coupled trans-conductors 303$_{1-N}$ at the tap points, and first and second drivers 302*a* and 302*b* operable to drive quadrature signals via sources 101*a* and 101*b* on to the first and second transmission lines.

Figure 4A:
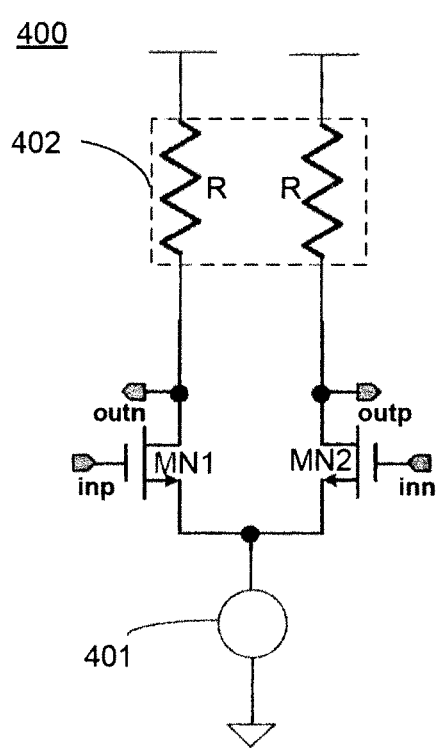
FIGS. 4A-B are high level illustrations trans-conductors used in the cross-coupled trans-conductors of the signal distribution network, according to one embodiment of the disclosure.
Figure 4B:
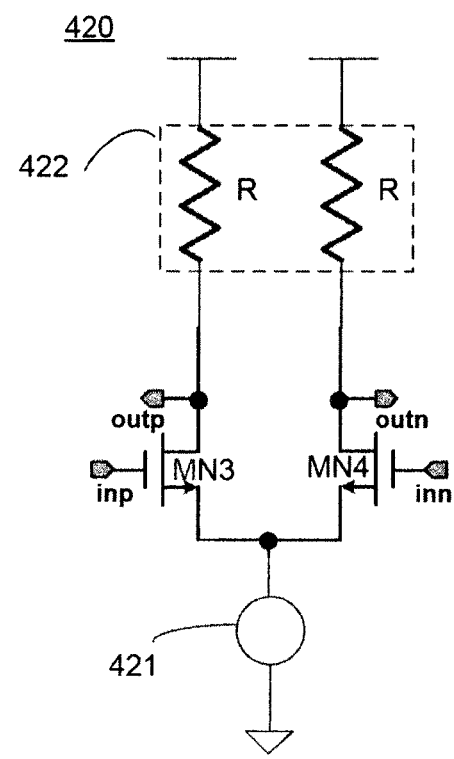

FIGS. 4A-B are high level illustrations of trans-conductors 400 and 420 used in the cross-coupled trans-conductor 103 of the signal distribution network, according to one embodiment of the disclosure. In one embodiment, the trans-conductor 400 is implemented as a differential amplifier with a current source 401 coupled to input devices MN1 and MN2, and a resistive load R 402 coupled together as shown. In one embodiment, the trans-conductor 420 is also implemented as a differential amplifier with a current source 421 coupled to input devices MN3 and MN4, and a resistive load 'R' 422 coupled together as shown. While the embodiments herein disclose differential signaling, the concepts discussed herein can be used for single ended signaling scheme.

FIGS. 5A-B are circuit level illustrations of trans-conductors of FIGS. 4A-B used in the cross-coupled trans-conductor 103 of the signal distribution network, according to one embodiment of the disclosure.

In one embodiment, the trans-conductor buffer 500/103a is a CML buffer. In one embodiment, the CML buffer 500/103a comprises an NMOS input differential pair MN1 and MN2, and PMOS active loads 402/502. In one embodiment, each PMOS active load comprises of a stack of four PMOS devices biased in the linear region and a diode connected PMOS device MP1 coupled to resistor 'R'. In one embodiment, the stack of PMOS devices is biased by pbias. While the embodiment of FIG. 5A illustrates four active PMOS devices, any number of PMOS devices may be stacked to control the output impedance of the CML buffer 402/502.

In one embodiment, the trans-conductor buffer 500/103a comprises a current source 401/501. In one embodiment, the current source 401/501 comprises a stack of four NMOS devices biased by nbias. The bias signals pbias and nbias are generated by any known bias generator circuit. While the embodiment of FIG. 5A illustrates four NMOS devices, any number of NMOS devices may be stacked to control the current source of the CML buffer 402/502.

In one embodiment, the stacked PMOS devices are used to reduce mismatch. In one embodiment, the diode-connection between drain and gate terminals of MP1 and MP2 are coupled to a resistor R. In one embodiment, the resistor 'R' offers larger output impedance at high frequencies than at DC/low frequencies. In one embodiment, the diode connection reduces the standard deviation of the mismatch-induced DC offset between the two outputs. For example, the DC offset is reduced from 47 mV to 20 mV. In one embodiment, downstream AC coupling prevents the DC offset from propagating through subsequent stages in the clock path.

Referring to FIG. 5B, in one embodiment the trans-conductor 520/103b comprises a circuit similar or identical to the trans-conductor 500/103a. In one embodiment, the trans-conductor 520/103b comprises an NMOS differential pair MN3 and MN4 coupled to form the input stage. In one embodiment, a stack of six PMOS devices is used as the load 422/522 to provide high output impedance and to reduce mismatch. In one embodiment, the trans-conductor 520/103b comprises a current source biased by nbias. In one embodiment, the current source comprises a stack of NMOS devices. In one embodiment, the number of NMOS devices in series in the stack is four. In other embodiments, other number of NMOS devices may be used for the current source.

As discussed with reference to FIG. 1, the polarity of trans-conductance of 103a and 103b is opposite. In one embodiment, the output nodes (outn and outp) in FIG. 5B are flipped relative to the output nodes of FIG. 5A to change the sign of the trans-conductance. In another embodiment, the output nodes (outn and outp) are the same for both FIG. 5A and FIG. 5B, but the input nodes (inp and inn) in FIG. 5B are flipped relative to the input nodes of FIG. 5A to change the sign of the trans-conductance.

In the embodiments of FIG. 5A and FIG. 5B, the bias signals pbias and nbais are generated by a low power bias circuit (not shown). In one embodiment, every cross-coupled trans-conductance $303_{1-N}$ (See FIG. 3) has a bias circuit to provide pbias and nbias signals to the respective trans-conductors 103a and 103b. In one embodiment, the bias circuit is a current mirror. In other embodiments, other forms of low power bias circuits may be used without changing the essence of the embodiments.

Figure 6:
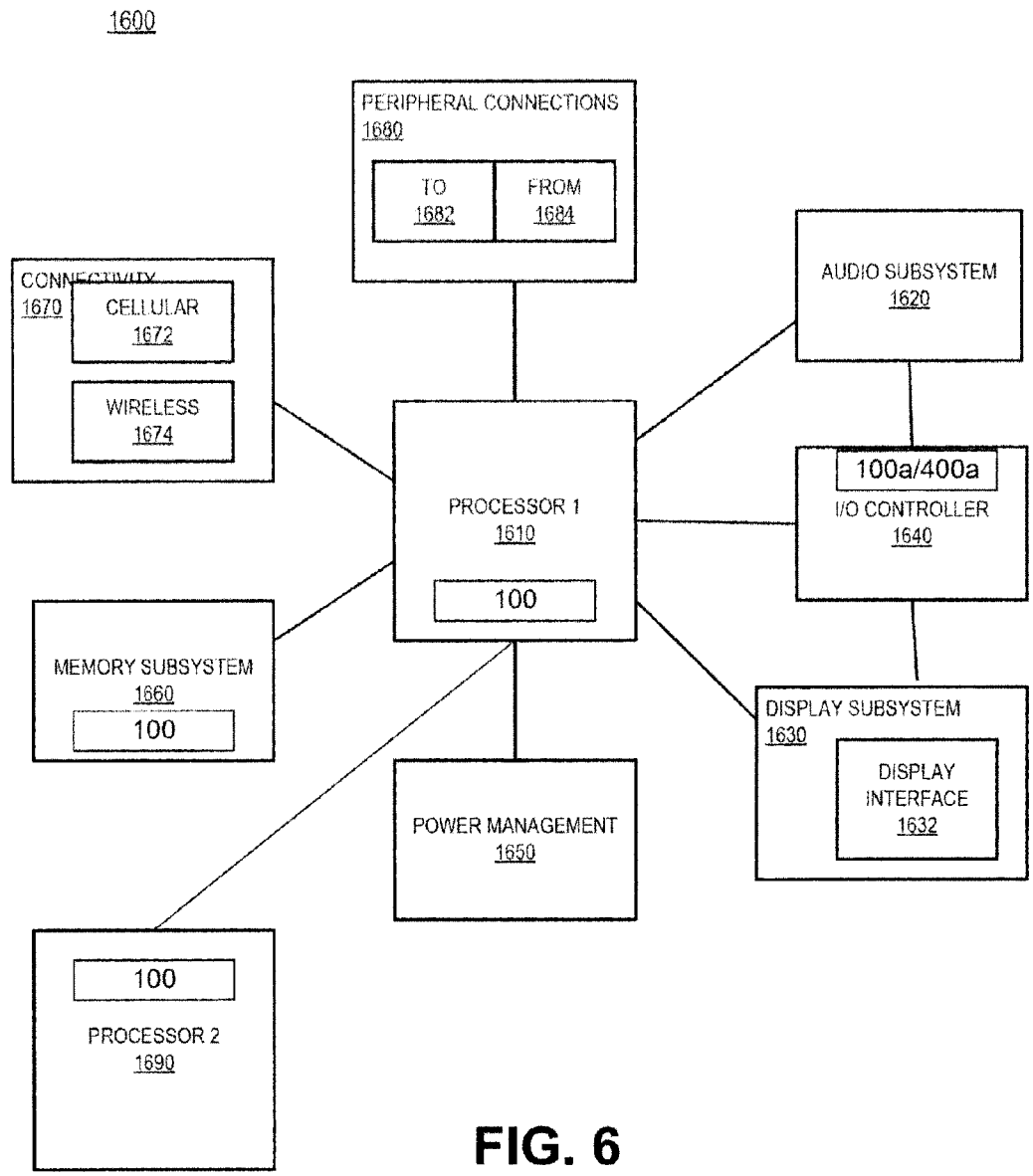
FIG. 6 is a system-level diagram of a smart device comprising a processor with the signal distribution network for suppressing phase errors in multiphase signals and extending bandwidth, according to one embodiment of the disclosure.

FIG. 6 is a system-level diagram of a smart computing device 1600 comprising a processor with the signal distribution network 100/300 for suppressing phase errors and extending bandwidth, according to one embodiment of the disclosure. FIG. 6 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the signal distribution network 100/300 to suppress phase errors and a second processor 1690 with the apparatus to suppress phase errors, according to the embodiments discussed herein. In one embodiment, the first processor 1610 transmits the signal and the second processor 1690 receives that signal, wherein signal distribution network 100/300 for suppressing phase errors and extending bandwidth is implemented on the transmitting end (i.e., first processor 1610) and the receiving end (i.e., second processor 1690).

The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment an integrated circuit comprises: a first buffer, with positive trans-conductance, to drive a first signal with first phase; and a second buffer, with negative trans-conductance, to drive a second signal with second phase, wherein the first buffer and the second buffer are cross-coupled to one another. In one embodiment, the integrated circuit further comprises: a first driver to drive the first signal with first phase over a first interconnect, and to provide the first signal with first phase to the first buffer. In one embodiment, the integrated circuit further comprises: a first receiver to receive the first signal with first phase over the first interconnect. In one embodiment, the integrated circuit further comprises: a second driver to drive the second signal with second phase over a second interconnect, and to provide the second signal with second phase to the second buffer.

In one embodiment, the first buffer is operable to drive the first signal of first phase over the second interconnect. In one embodiment, the second buffer is operable to drive the second signal of second phase over the first interconnect. In one embodiment, the integrated circuit further comprises: a second receiver to receive the second signal with second phase over the second interconnect. In one embodiment, the positive trans-conductance and the negative trans-conductance have substantially the same magnitudes. In one embodiment, the first and second phases are about 90 degrees apart from one another. In one embodiment, the first and second buffers are differential buffers which comprise: a pair of input devices to receive the first or second signals with respective first or second phases; a resistive load coupled to the pair of input devices; and a current source coupled to the pair of input devices.

In another example, a system comprises: a memory; and a processor coupled to the memory, the processor having a clock distribution network according to the integrated circuit discussed herein. In one embodiment, the system further comprises a wireless interface to communicatively couple the processor with another device. In one embodiment, the system further comprises a display.

In another example, a signal distribution network comprises: a first driver to drive a first signal with first phase over a first interconnect; a second driver to drive a second signal with second phase over a second interconnect; and a cross-coupled pair of buffers coupled to the first and second drivers and the first and second interconnects, the pair of buffers having a first buffer with first trans-conductance and a second buffer with second trans-conductance. In one embodiment, the first trans-conductance is a positive trans-conductance. In one embodiment, the second trans-conductance is a negative trans-conductance.

In one embodiment, the first buffer, with positive trans-conductance, is operable to drive the first signal with the first phase to the second interconnect. In one embodiment, the second buffer, with negative trans-conductance, is operable to drive the second signal with the second phase to the first interconnect. In one embodiment, the positive trans-conductance and the negative trans-conductance have substantially the same magnitudes. In one embodiment, the first and second phases are about 90 degrees apart from one another. In one embodiment, the first and second drivers are identical. In one embodiment, the first and second buffers are differential buffers which comprise: a pair of input devices to receive the first or second signals with respective first or second phases; a resistive load coupled to the pair of input devices; and a current source coupled to the pair of input devices. In one embodiment, the first and second signals are the same signals, and wherein the first and second phases are about 90 degrees apart from one another.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit comprising:
    a quadrature network including a first driver to drive a Q signal over a first interconnect structure and a second driver to drive an I signal over a second interconnect structure, the phase of the Q signal lagging the phase of the I signal by 90°;
    a first buffer, with positive trans-conductance, having an input coupled to an output of the first driver and an output coupled to an output of the second driver; and,
    a second buffer, with negative trans-conductance, having an input coupled to the output of the second driver and an output coupled to the output of the first driver.

2. The integrated circuit of claim 1 wherein the I signal and Q signal are differential signals.

3. The integrated circuit of claim 2, wherein the first buffer is a differential buffer.

4. The integrated circuit of claim 2, wherein the second buffer is a differential buffer.

5. The integrated circuit of claim 1 further comprising:
    receivers to respectively receive the I signal and the Q signal.

6. The integrated circuit of claim 1, wherein the positive trans-conductance and the negative trans-conductance have substantially the same magnitudes.

7. The integrated circuit of claim 1
    further comprising, third and fourth buffers disposed between the first and second interconnect structures downstream from the first and second buffers, the third buffer having positive transconductance and having an input coupled to the first interconnect structure and an output coupled to the second interconnect structure, the fourth buffer having negative transconductance and having an input coupled to the second interconnect structure and an output coupled to the first interconnect structure.

8. A system comprising:
a memory; and
a processor coupled to the memory, the processor having a clock distribution network including:
   a quadrature network including a first driver to drive a Q signal over a first interconnect structure and a second driver to drive an I signal over a second interconnect structure, the phase of the Q signal lagging the phase of the I signal by 90°;
   a first buffer, with positive trans-conductance, having an input coupled to an output of the first driver and an output coupled to an output of the second driver; and,
   a second buffer, with negative trans-conductance, having an input coupled to the output of the second driver and an output coupled to the output of the first driver.

9. The system of claim 8, wherein the I signal and Q signal are differential signals.

10. The system of claim 8, wherein the positive trans-conductance and the negative trans-conductance have substantially the same magnitudes.

11. The system of claim 8, wherein the I signal and Q signal are differential signals and the first buffer and the second buffer are differential amplifiers.

12. The system of claim 8 further comprises a wireless interface to communicatively couple the processor with another device.

13. The system of claim 8 further comprises a display.

14. A signal distribution network comprising:
   a first driver to drive a first signal with first phase over a first interconnect;
   a second driver to drive a second signal with second phase over a second interconnect, the phase of the first signal lagging the phase of the second signal by 90° and
   a cross-coupled pair of buffers coupled to the first and second drivers and between the first and second interconnects, the pair of buffers having a first buffer with positive trans-conductance and a second buffer with negative trans-conductance, the first buffer having an input coupled the first interconnect and an output coupled to the second interconnect, the second buffer having an input coupled to the second interconnect and an output coupled to the first interconnect.

15. The signal distribution network of claim 14, wherein the first and the second signals are differential signals.

16. The signal distribution network of claim 15, wherein the first and second buffers are differential buffers.

17. The signal distribution network of claim 14, wherein the positive trans-conductance and the negative trans-conductance have substantially the same magnitudes.

18. The signal distribution network of claim 14, wherein the first and second drivers have a same design.

19. The signal distribution network of claim 14,
   further comprising, third and fourth buffers disposed between the first and second interconnects downstream from the first and second buffers, the third buffer having positive transconductance and having an input coupled to the first interconnect and an output coupled to the second interconnect, the fourth buffer having negative transconductance and having an input coupled to the second interconnect and an output coupled to the first interconnect.

* * * * *